United States Patent
Ishibashi

(10) Patent No.: US 7,783,204 B2
(45) Date of Patent: Aug. 24, 2010

(54) OPTICAL TRANSMITTER TO SUPPRESS ABRUPT INCREASE OF DRIVING CURRENT FOR LASER DIODE DURING UNSTABLE APC LOOP AND A METHOD TO CONTROL THE SAME

(75) Inventor: Hiroto Ishibashi, Yokohama (JP)

(73) Assignee: Sumitomo Electric Industries Ltd., Osaka (JP)

( * ) Notice: Subject to any disclaimer, the term of this patent is extended or adjusted under 35 U.S.C. 154(b) by 544 days.

(21) Appl. No.: 11/892,562

(22) Filed: Aug. 23, 2007

(65) Prior Publication Data

US 2008/0063412 A1 Mar. 13, 2008

(30) Foreign Application Priority Data

Aug. 25, 2006 (JP) .............................. 2006-229342

(51) Int. Cl.
*H04B 10/04* (2006.01)
(52) U.S. Cl. .................... 398/198; 398/183; 398/187
(58) Field of Classification Search ............... 398/183, 398/195–198

See application file for complete search history.

(56) References Cited

U.S. PATENT DOCUMENTS

| 6,195,371 | B1 * | 2/2001 | Haneda et al. | 372/29.01 |
| 7,106,768 | B2 | 9/2006 | Murata | 372/37.02 |
| 2004/0032890 | A1 * | 2/2004 | Murata | 372/38.02 |
| 2005/0286575 | A1 * | 12/2005 | Hattori | 372/29.02 |

OTHER PUBLICATIONS

XENPAK 10 Gigabit Ethernet MSA (Issue 3.0, Sep. 18, 2002).

* cited by examiner

*Primary Examiner*—Leslie Pascal
(74) *Attorney, Agent, or Firm*—Smith, Gambrell & Russell, LLP

(57) ABSTRACT

The present invention discloses an optical transmitter that provides a function to vary the rate of the increase of the bias and modulation currents and their practical values during the APC feedback loop is left unstable without prolonging this unstable period. The optical transmitter of the invention includes a controller configured to read initial parameters from the memory, to increase the bias and modulation currents in stepwise based on thus read initial parameters, and to begin the automatic feedback control to keep the optical output from the laser diode constant after the bias and modulation currents reach their temporarily target values.

8 Claims, 2 Drawing Sheets

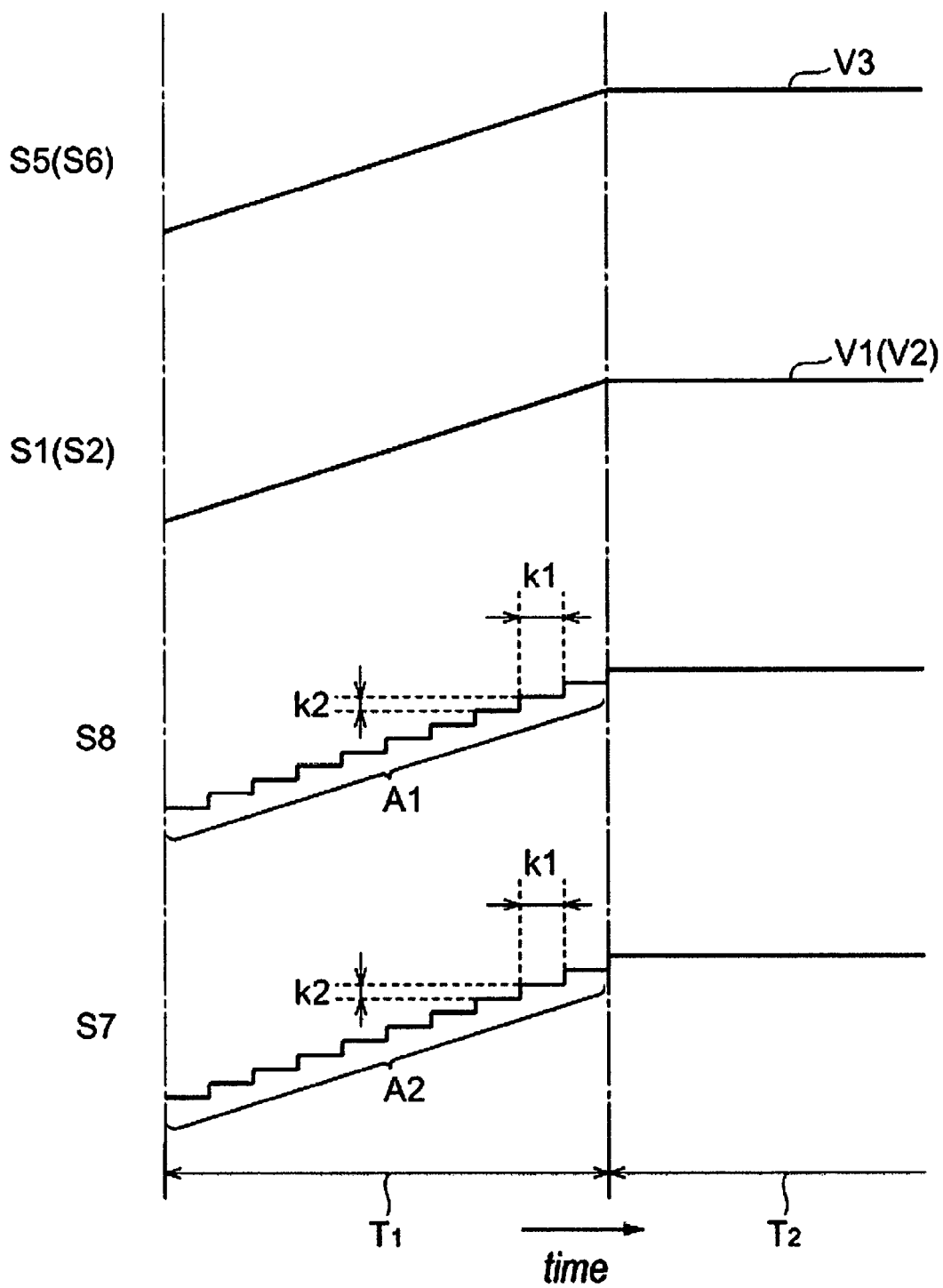

OPTICAL TRANSMITTER TO SUPPRESS ABRUPT INCREASE OF DRIVING CURRENT FOR LASER DIODE DURING UNSTABLE APC LOOP AND A METHOD TO CONTROL THE SAME

BACKGROUND OF THE INVENTION

1. Filed of the Invention

The present invention relates to a control circuit for a semiconductor laser diode and a method for controlling the same.

2. Related Prior Art

A co-operation agreement for an optical transceiver type of the XENPACK has ruled the maximum current and the rate to increase the power supply current when the transceiver is powered on.

A conventional and general control the supplied current, namely the bias and modulation currents, for the LD comprises an automatic power control (hereafter denoted as APC) operation where an initial parameter is set at the beginning of the powering of the LD and two currents above are adjusted so as to keep the optical output monitored by a photodiode (hereafter denoted as PD) to be equal to the initial parameter. However, the conventional APC operation is unable to follow the maximum current and the power consumption, because the conventional APC operation is unable to suppress the rush current at the powering of the transmitter.

Moreover, when the APC operation begins at the powering of the transmitter, it takes much time to stabilize the optical output from the LD because large overshoots and undershoots in the driving current to the LD inevitably accompany with the APC operation. Thus, the present invention is to provide an optical transmitter that may suppress the rush current at the powering, that is, to adjust the rate of increase of the bias and modulation currents and their practical values at the powering of the transmitter without prolonging the period from the powering to obtain a predetermined optical output from the LD, and is to provide a method to control the rush current of the optical transmitter.

SUMMARY OF THE INVENTION

According to the present invention, a method to control an optical transmitter is provided. The optical transmitter includes a semiconductor laser diode, a photodiode, a controller with a memory and a driver. These elements constitute an automatic power control (APC) loop for the laser diode by supplying a bias current and a modulation current. The method of the invention includes steps of: (a) accessing the memory by the controller to read initial parameters at the powering on the optical transmitter; (b) increase the bias and modulation currents by the controller to respective target values in stepwise; and (c) starting the APC loop after the bias and modulation currents reach respective target values. The initial parameters may include the step width, the step height and the target values.

Since the transmitter of the present invention provides a function to vary the bias and modulation currents in stepwise at the powering of the optical transmitter and the APC operation begins after the bias and modulation currents reach their initial target values, the abrupt increase of the driving current to the LD thus the power consumption of the optical transmitter during the unstable APC operation may be prevented.

The controller may output digital control signals for the bias and modulation currents, and may convert the digital control signals into corresponding analog control signals to send thus converted analog control signals to the driver. The controller may further provide an integral filter for filtering the analog control signal, which may further prevent the abrupt increase of the bias and modulation currents at each step of the stepwise increase.

The other aspect of the invention relates to an optical transmitter that comprises a semiconductor laser diode, a driver, a photodiode, and a controller. These elements constitute the APC loop, that is, the driver provides the bias and modulation current to the laser diode based on the control signals sent from the controller, the photodiode monitors the optical output power from the laser diode, and the controller controls the optical output power from the laser diode so as to compare the output from the photodiode with a reference and to send the control signals to the driver to keep the comparison constant.

The controller of the invention provides the control signals that vary in stepwise at the powering of the transmitter and, after the bias and modulation currents reach their temporarily target values, the controller begins the APC operation described above. Thus, the optical transmitter of the invention may prevent the rush current, namely, the abrupt increase of the driving current to the laser diode, accordingly the power consumption of the transmitter.

BRIEF DESCRIPTION OF DRAWINGS

FIG. 2 shows a time chart of various signals to control the laser diode within the optical transmitter.

DESCRIPTION OF PREFERRED EMBODIMENTS

Figure 1:
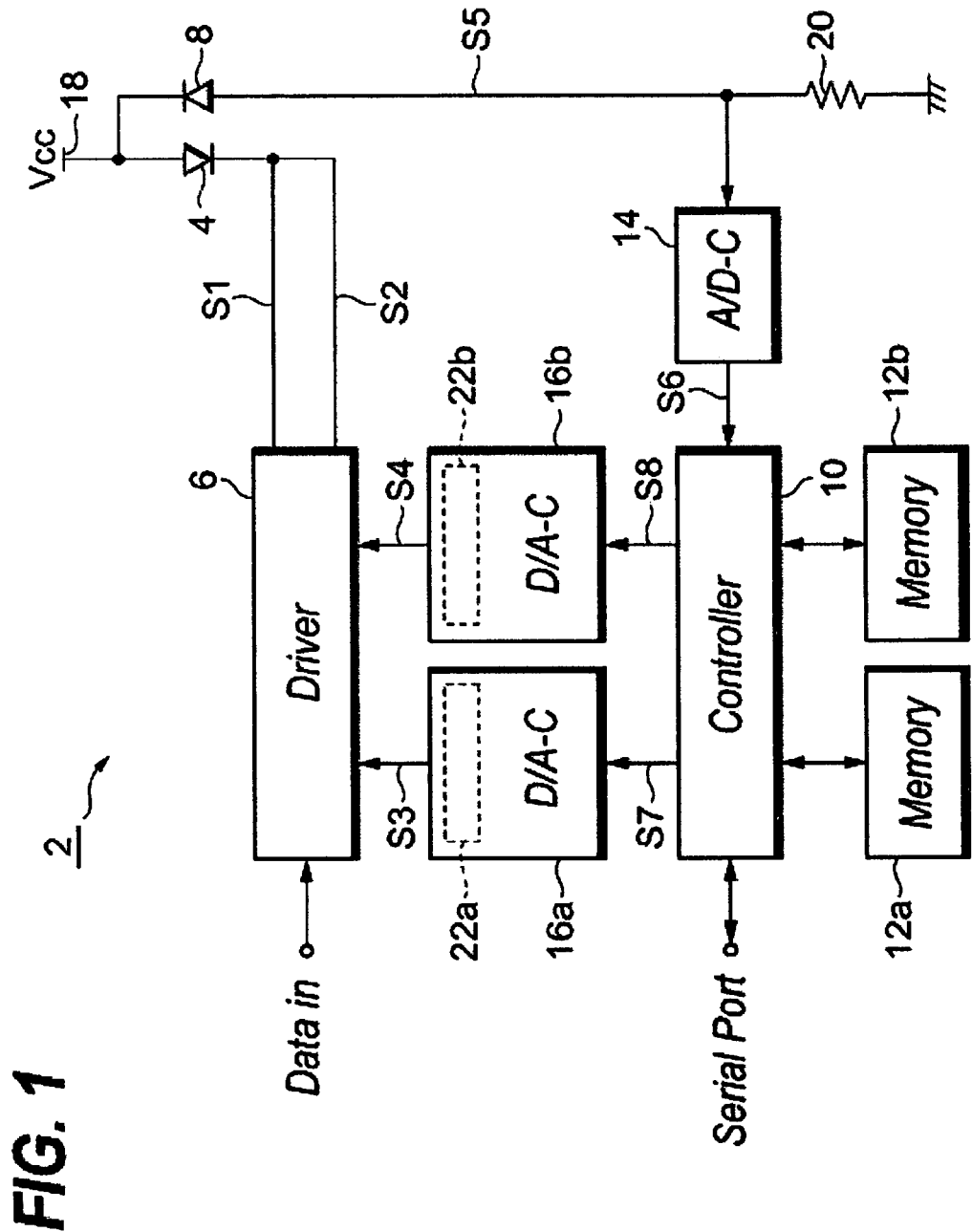
FIG. 1 is a block diagram showing an optical transmitter according to an embodiment of the present invention.

Next, preferred embodiments of the present invention will be described as referring to accompanying drawings. In the description of the drawings, the same numeral or the same symbol will refer to the same elements without overlapping explanations.

FIG. 1 is a block diagram illustrating an optical transmitter for a semiconductor laser diode according to the present invention. The optical transmitter 2 will be installed on an optical transceiver, which is not shown in FIG. 1. The transmitter 2 includes a semiconductor laser diode (hereafter denoted as LD) 4, a driver 6, a photodiode (hereafter denoted as PD) 8 to monitor the optical output from the LD 4, and a controller 10 that includes two memories, 12a and 12b, one of which 12a is for storing the initial parameters and the other of which 12b is for storing the parameters for operating the APC loop described below.

The transmitter 2 further provides an analog-to-digital converter (hereafter denoted as A/D-C) 14, two digital-to-analog converters (hereafter denoted as D/A-C), 16a and 16b, a power supply 18, and a resistor 20. One D/A-C 16a sets the modulation current for the LD 4, while, the other D/A-C 16b sets the bias current. The LD 4, whose anode electrode is connected to the power supply, while, the cathode electrode thereof is connected to the driver, emits light by providing the modulation current S1 and the bias current S2 from the driver 6. The driver 6 receives a data signal to be transmitted from the primary unit within the optical transceiver, and supplies the modulation current S1 and the bias current S2 to the LD 4 based on this received data signal and two control signals, S3 and S4, sent from respective D/A-Cs, 16a and 16b.

The PD 8, as mentioned previously, monitors the optical output from the LD 4. The cathode of the PD 8 receives the power supply 18, while, the anode thereof is connected to the resistor 20 and to the A/D-C 14. An output signal S5 from the anode of the PD 8, which is a photocurrent generated by the PD 8, is converted to a voltage signal by the resistor 20. The A/D-C 14 receives this voltage signal, converts it to a digital signal S6 and sends this digital signal S6 to the controller 10.

The controller 10 adjusts the bias current S1 and the modulation current S2 by controlling the driver 6 based on the signal S6 derived from the output of the PD 8 as accessing one of the memory 12b that stores preset data for the auto-power-control (APC) of the LD 4. Detail of the preset data will be described later. The controller outputs a signal S7 for controlling the bias current S1 to the first D/A-C 16a, while another signal S7 for controlling the modulation current S2 to the second D/A-C 16b. The D/A-Cs, 16a and 16b, convert thus received data, S7 and S8, into corresponding analog signals, S3 and S4, respectively, and output the analog signals, S3 and S4, to the driver S6.

The controller 10 accesses the first memory 12a to obtain an initial parameter when the. LD is initially operated. This initial parameter relates to a value to increase the bias current S1 and the modulation current S2 from the initial value, for instance, zero, to respective target values, V1 and V2 illustrated in FIG. 2. The controller 10 may generate stepwise signals, S7 and S8, such that the driver 6 provides two currents, S1 and S2, increasing from initial values to target values, V1 and V2, respectively. The controller 10 sends the APC signals, S7 and S8, to the driver to perform the APC function by accessing the APC memory 12b after two currents, S1 and S2, reaches the target values by this stepwise signals.

Further, the controller 10 provides a serial port to communicate with the primary unit of the optical transceiver that installs the transmitter 2. Accordingly, the controller 10 may receive preset data and APC data to be stored in memories, 12a and 12b, from the outside of the transceiver through this serial port and the primary unit of the transceiver. Thus, the preset memory 12a stores initial data for the controller 10 to operate the LD 4 through the driver 6 in such a way mentioned above, while, the APC memory 12b stores data for the controller 10 to carry out the APC function.

Next, the method to control the LD 4 by the controller 10 will be described as referring to FIG. 2 which is a time chart for the controller 10. First, the controller 10 reads the target values of two currents, the bias and the modulation currents, S1 and S2, and the initial data to vary these two currents in stepwise to respective target values from the first memory 12a. The controller 10 controls the driver 6 based on thus obtained data. The APC closed loop constituted by the driver 6, the LD 4, the PD 8 and the controller 10 starts its operation after the bias and the modulation currents, S1 and S2, both reach their target values, V1 and V2, to establish the ACP loop. Thus, the optical output from the LD 3 may be controlled by the APC closed loop and two memories, 12a and 12b, each storing the initial data and parameters for the APC loop.

At the powering up the LD 4, T1, the control signals, S7 and S8, output prom the controller 10 increases in stepwise with respect to the time t as shown by A1 and A2 in FIG. 2. Adjusting the bias and the modulation currents, S1 and S2, based on these stepwise signals, S7 and S8, by the controller 10, the practical bias and modulation currents monotonically increases for the period T1 when these currents reach their target values, V1 and V2. The signal S5 output from the PD 8, equivalently its digitally transformed signal S6, monotonically increases for the period T1 from its initial value.

At the time T2 when the bias and modulation currents, S1 and S2, both reach their target values, V1 and V2, respectively, the signals S7 and S8 are changed to values for operating the APC closed loop by the controller 10 to read these values from the second memory 12b. The APC loop operates the bias and modulation currents, S1 and S2, based on these two digital values, S7 and S8, so as to adjust the optical output from the LD 4.

Thus, because the bias and modulation currents, S1 and S2, may increase from their zero value to target values, V1 and V2, respectively in stepwise during the period T1, the controller 10 may vary the rate of the increase by increasing or decreasing the period T1. The adjustment of the period T1 may be performed by arranging the step width K1 and the step height K2 of the control signals, S7 and S8. Accordingly, the rate of the increase of the bias and modulation currents, S1 and S2, and their practical values may be suppressed without prolonging the period T1 from the powering of the LD 4 to the time when the predetermined target output power is obtained, which may suppress the abrupt increase of the power consumption of the optical transmitter.

The foregoing discloses and describes merely exemplary embodiments of the present invention. However, one skilled in the art will readily recognize that various changes, modifications and variations can be made without departing from the spirit and scope of the invention as defined in the following claims.

For instance, two D/A-Cs, 16a and 16b, may provide respective filters, 22a and 22b, that integrates the stepwise control signals, S7 and S8, output from the controller 10. The time constant of these filters, 22a and 22b, corresponds to the step width K1 of the signals, S7 and S8. The D/A-Cs, 16a and 16b, convert the digitally signals, S7 and S8, to analog forms and send them to respective filters, 22a and 22b. Providing the filtered signals, S3 and S4, from these filters, 22a and 22b, to the driver 6, these filtered signals, S3 and S4, show smoother behaviors comparing to their original digital signals, S7 and S8. Without the filters, the bias and modulation currents, S1 and S2, may occasionally increase in abrupt following the step height K2. These filters, 22a and 22b, may suppress such abrupt increase of the bias and modulation currents, S1 and S2, at the step K2.

I claim:

1. A method for controlling an optical transmitter that includes a semiconductor laser diode, a photodiode, a controller with a memory and a driver that constitutes an auto-power control loop for the laser diode by supplying a bias current and a modulation current, the method comprising steps of:
   (a) accessing the memory by the controller to read initial parameters;
   (b) increasing the bias current and the modulation current by the controller to respective target values in stepwise; and
   (c) starting the auto-power control loop after the bias current and the modulation current reach respective target values.

2. The method according to claim 1,
   wherein the step (a) includes a step for reading a step width and a step height for the bias current and the modulation current from the memory by the controller.

3. The method according to claim 1,
   wherein the step (a) includes a step for reading the target values of the bias current and the modulation current.

4. The method according to claim 1,
   wherein the step (b) includes steps of
   outputting digital control signals for the bias current and for the modulation current from the controller,
   converting the digital control signals into corresponding analog control signals, integrally filtering the analog control signals, and outputting the filtered analog control signals to the driver.

5. The method according to claim 1, wherein the step (c) includes a step for accessing the memory by the controller to read parameters for the auto-power control loop.

6. The method according to claim 5, wherein the step (c) includes a step for reading a target optical output power from the memory.

7. An optical transmitter, comprising:
a semiconductor laser diode;
a driver for providing a bias current and a modulation current to the semiconductor laser diode;
a photodiode to monitor an optical output power of the laser diode; and
a controller with a memory, the controller outputting control signals each corresponding to the bias current and the modulation current to the driver to adjust the bias current and the modulation current based on the optical output power monitored by the photodiode so as to keep the optical output power of the laser diode constant,
wherein the memory stores initial parameters of the optical transmitter, and
wherein the controller reads the initial parameters from the memory and varies the control signals in stepwise to respective target values and begins the auto-power control loop after the bias current and the modulation current reach respective target values.

8. The optical transmitter according to claim 7, further comprising two integral filters each corresponding to the control signals for the bias current and the modulation current output from the controller,
wherein the driver receives the control signals from the controller through the integral filter.

* * * * *